United States Patent [19]
Kato

[11] Patent Number: 6,067,037
[45] Date of Patent: May 23, 2000

[54] DIGITAL-TO-ANALOG CONVERTER IMPLEMENTED BY SIMPLE SWITCHED CAPACITOR ARRAY AND METHOD FOR CONTROLLING THEREOF

[75] Inventor: Fumihiko Kato, Yamagata, Japan

[73] Assignee: NEC Corporation, Tokyo, Japan

[21] Appl. No.: 09/103,532

[22] Filed: Jun. 24, 1998

[30] Foreign Application Priority Data

Jun. 25, 1997 [JP] Japan ................................. 9-168824

[51] Int. Cl.[7] .................................................. H03M 1/76
[52] U.S. Cl. ........................................ 341/150; 341/144
[58] Field of Search ................................... 341/144, 150, 341/146, 145

[56] References Cited

U.S. PATENT DOCUMENTS

| | | | |
|---|---|---|---|
| 5,781,139 | 7/1998 | Weisbrod | 341/150 |
| 5,892,473 | 4/1999 | Shin | 341/150 |

FOREIGN PATENT DOCUMENTS 61-39726  2/1986  Japan .

*Primary Examiner*—Brian Young
*Attorney, Agent, or Firm*—Foley & Lardner

[57] ABSTRACT

A digital-to-analog converter has a single capacitor array having plural weighted capacitors, a first capacitor connected between an output node of an operational amplifier and an inverted input node of the operational amplifier and a second capacitor both connected to the inverted input node, and a pulse signal, a polarity control signal maintained in one of the high level and the low level over each pulse period of the pulse signal and a multi-bit digital signal are supplied to a controller; the controller causes a switching unit to selectively supply a first reference voltage and a second reference voltage to the weighted capacitors depending upon the logic level of the data bits of the digital signal and, thereafter, a third reference voltage to the weighted capacitors in a certain pulse period, and the switching unit carries out the switching action in the opposite order to the previous pulse period so that the operational amplifier varies an analog output signal with respect to a potential level supplied to the non-inverted input node thereof.

20 Claims, 6 Drawing Sheets

DIGITAL-TO-ANALOG CONVERTER IMPLEMENTED BY SIMPLE SWITCHED CAPACITOR ARRAY AND METHOD FOR CONTROLLING THEREOF

FIELD OF THE INVENTION

This invention relates to a digital-to-analog converter and, more particularly, to a digital-to-analog converter implemented by a switched capacitor array and a method for controlling thereof.

DESCRIPTION OF THE RELATED ART

A typical example of the digital-to-analog converter implemented by a switched capacitor array is disclosed in Japanese Patent Publication of Unexamined Application No. 61-39726. FIG. 1 illustrates the prior art digital-to-analog converter. The prior art digital-to-analog converter comprises a balanced operation al amplifier 1, two capacitor arrays 2a/2b, two arrays of switching elements 3a/3b, a controller 4, two capacitors 5a/5b and two switching elements 6a/6b. The balanced operational amplifier 1 has an inverted input node (−), a non-inverted input node (+), an inverted output node (−) and a non-inverted output node (+). The capacitor 5a and the switching element 6a are connected in parallel between the inverted input node (−) and the non-inverted output node (+), and the capacitor 5b and the switching element 6b are connected in parallel between the non-inverted input node (+) and the inverted output node (−).

Four capacitors form the capacitor array 2a, and the other capacitor array 2b is implemented by a parallel combination of four capacitors. The capacitance is twice increased from the leftmost capacitor toward the rightmost capacitor of each capacitor array 2a/2b, and, for this reason, the four capacitors are labeled with "C", "2C", "4C" and "8C".

The four capacitors of the first capacitor array 2a are connected to a switching element 7a, and the capacitors of the other capacitor array 2b are connected to a switching element 7b. The switching elements 7a/7b are responsive to a control signal CTL1 so as to change the electrical connection between the capacitor arrays 2a/2b and the inverted/non-inverted input nodes (−)/(+). The switching element 7a connects the capacitor array 2a to the inverted input node (−) or the non-inverted input node (+), and the other switching element 7b connects the other capacitor array 2b to the non-inverted input node (+) or the inverted input node (−).

The array of switching elements 3a has four switching elements SP1/SP2/SP3/SP4, which are respectively associated with the four capacitors of the capacitor array 2a. The controller 4 supplies a control signal CTL2 to the four switching elements SP1 to SP4, and the four switching elements SP1 to SP4 are responsive to the control signal for changing electrical connection to the four capacitors between a source of reference voltage Vref and the ground voltage level $V_{GND}$. Similarly, the array of switching elements 3b has four switching elements SN1/SN2/SN3/SN4 associated with the four capacitors of the capacitor array 2b. The controller also supplies the control signal CTL2 to the four switching elements SN1 to SN4, and the four switching elements SN1 to SN4 connect the capacitors of the capacitor array 2b between the source of reference voltage Vref and the ground voltage level $V_{GND}$. Thus, the reference voltage Vref and the ground voltage are alternately supplied to the two capacitor arrays 2a/2b, and the analog output signal is varies with respect to the reference voltage Vref.

The prior art digital-to-analog converter requires two switched capacitor arrays 2a/3a and 2b/3b for the analog output signal varied with respect to the reference voltage Vref, and the two switched capacitor arrays 2a/3a and 2b/3b complicates the circuit configuration and the controlling sequence.

SUMMARY OF THE INVENTION

It is therefore an important object of the present invention to provide a digital-to-analog converter, which has a simple circuit configuration.

It is also an important object of the present invention to provide a method for controlling the digital-to-analog converter.

To accomplish the object, the present invention proposes to change the order of potential supply.

In accordance with one aspect of the present invention, there is provided a digital-to-analog converter comprising an operational amplifier having an inverted input node, a non-inverted input node and an output node, a first capacitor connected between the output node and the inverted input node and having a capacitance $2^N$ times larger than a reference capacitance, the N is a natural number, a first capacitor array connected to the inverted input node and having a plurality of second capacitors equal in number to the N and different in capacitance from one another, the capacitance of the plurality of second capacitors being stepwise varied from $2^0$ times larger than the reference capacitance to $2^{N-1}$ times larger than the reference capacitance, a third capacitor connected to the inverted input node and having a capacitance equal to the reference capacitance, a first switching element connected between the output node and the inverted input node and responsive to a first control signal so as to electrically connect the output node to the inverted input node, a switching unit having an input port connected to a source of first voltage, a source of second voltage, a source of third voltage and source of fourth voltage and an output port connected to the plurality of second capacitors, the third capacitor and the non-inverted input node and responsive to a second control signal so as to selectively supply the first voltage level, the second voltage level and the third voltage level to the plurality of second capacitors and the third capacitor, the switching unit continuously supplying the fourth voltage to the non-inverted input node and a controlling unit connected to the switching unit and responsive to external control signals and a digital signal having data bits equal in number to the N so as to change the first control signal and the second control signal between an active level and an inactive level, the external signals define a first time period, a second time period next to the first time period, a third time period after the second time period and a fourth time period next to the third time period depending upon the combination of potential levels of the external control signals, the digital signal is indicative of a first analog value in the first and second time periods and a second analog value in the third and fourth time periods, the controlling unit causes the first switching element to electrically connect the output node to the inverted input node in the first time period and the third time period and disconnect the output node from the inverted input node in the second time period and the fourth time period, the controlling unit causes the switching unit to selectively supply the first voltage and the second voltage to the plurality of second capacitors depending upon the data bits and the second voltage to the third capacitor in the first time period, the controlling unit causes the switching unit to supply the third voltage to the plurality of second capacitors and the third capacitor in the second time period so that the operational amplifier determines an output potential level at the output node, the controlling unit causes the switching unit to supply the third voltage to the plurality of second capacitors and the third capacitor in the third time period, and the controlling unit causes the switching unit to selectively supply the first voltage and the second voltage to the plurality of second capacitors depending upon the data bits and the second voltage to the third capacitor, thereby causing the operational amplifier to determine the output potential level.

In accordance with another aspect of the present invention, there is provided a method of controlling a digital-to-analog converter defined in claim 1 or 9 comprising the steps of keeping one of the external signals in a first level in the first and second time periods equal to a pulse period of another of the external signals, and changing the one of the external signals in a second level different from the first level in the third and fourth time periods equal to the pulse period of the another of the external signals thereby causing the operational amplifier to vary the voltage level at the output node with respect to the fourth voltage.

BRIEF DESCRIPTION OF THE DRAWINGS

The features and advantages of the digital-to-analog converter and the controlling method will be more clearly understood from the following description taken in conjunction with the accompanying drawings in which.

DESCRIPTION OF THE PREFERRED EMBODIMENTS

First Embodiment

Figure 1:
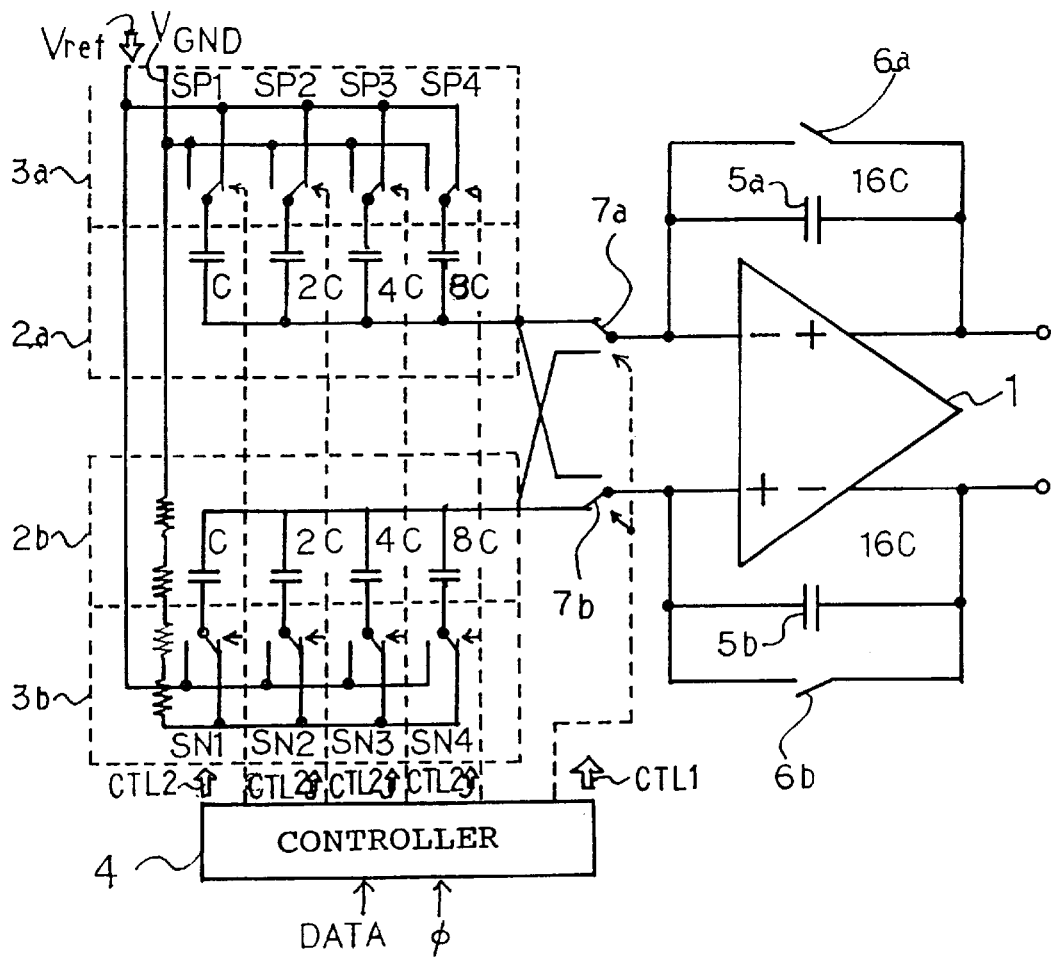
FIG. 1 is a circuit diagram showing the circuit configuration of the prior art digital-to-analog converter disclosed in Japanese Patent Publication of Unexamined Application No. 61-39726.
Figure 2:
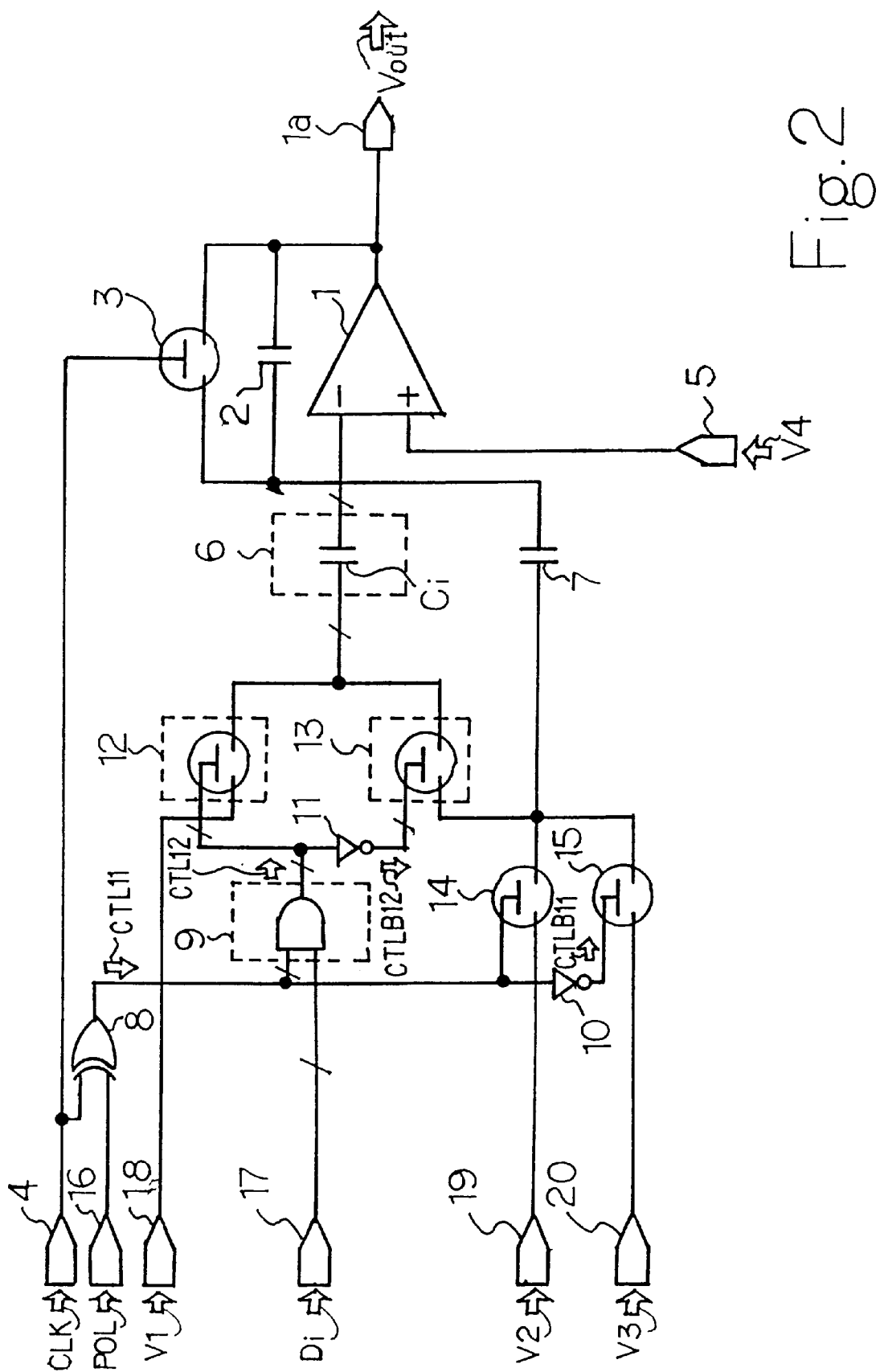
FIG. 2 is a circuit diagram showing the circuit configuration of a digital-to-analog converter according to the present invention.

Referring first to FIG. 2 of the drawings, a digital-to-analog converter embodying the present invention largely comprises an operational amplifier 1. The operational amplifier 1 has an inverted input node (−), a non-inverted input node (+) and an output node, and a capacitor 2 and a switching element 3 are connected in parallel between the output node and the inverted input node (−). The capacitor 2 has capacitance $2^N$ times larger than a reference capacitance Cref, and is labeled with "C1" representative of the capacitance. A clock signal CLK is supplied from a clock terminal 4 to the switching element 3, and the switching element 3 connects the output node to and disconnects it from the inverted input node (−) in response to the clock signal CLK. Reference voltages V1, V2, V3 and V4 are supplied to the digital-to-analog converter, and the reference voltages V1 and V4 determine the potential level of an analog output signal Vout. The reference voltage V4 is supplied from a voltage terminal 5 to the non-inverted input node (+), and the operational amplifier 1 supplies the analog output signal Vout from the output node to an output terminal 1a.

The digital-to-analog converter further comprises an array 6 of N capacitors connected to the inverted input node (−) and a single capacitor 7 also connected to the inverted input node (−). N represents a natural number. Each of the N capacitors 6 is referred to as "capacitor Ci" where i is an integer ranging between 0 and N−1, i.e., $0 \leq i \leq N-1$. The capacitance is increased from $(Cref \times 2^0)$ to $(Cref \times 2^{N-1})$. On the other hand, the capacitor 7 has capacitance equal to the reference capacitance Cref.

The digital-to-analog converter further comprises an exclusive-OR gate 8, an array of AND gates 9, an inverter 10, an array of inverters 11, two arrays of switching elements 12/13 and switching elements 14/15. Each of the arrays 12/13 has N switching elements, and N represents the natural number. The switching elements of the array 12 are respectively connected to the N capacitors Ci of the capacitor array 6. Similarly, the switching elements of the array 13 are respectively connected to the N capacitors Ci of the capacitor array 6.

The exclusive-OR ate 8 has two input nodes one of which is connected to the clock terminal 4 and the other of which is connected to a control terminal 16. As described hereinbefore, the clock signal CLK is supplied to the clock terminal 4, and a polarity control signal POL is supplied to the control terminal 16. The polarity control signal POL is exclusive-ORed with the clock signal CLK, and the exclusive-OR gate 8 yields a control signal CTL11.

The array of AND gates 9 has two input nodes. One of the input nodes is connected to the output node of the exclusive-OR gate 8, and the other of the input nodes is connected to a data terminal 17. An N-bit digital signal Di is supplied to the data terminal 17, and the N-bits are ANDed with the control signal CTL11 so as to produce control signals CTL12. The suffix "i" ranges from zero to (N−1), and N is the natural number.

Reference voltage V1 is supplied from a voltage terminal 18 to the array 12 of switching element, and reference voltages V2 and V3 are supplied from voltage terminals 19/20 to the switching elements 14/15, respectively. The array 12 of switching elements is connected between the voltage terminal 18 and the array 6 of capacitors, and is controlled with the control signals CTL12. The array 12 of switching elements transfers the reference voltage V1 to the array 6 of capacitors or interrupts the propagation of the reference voltage V1 depending upon the levels of the control signals CTL12.

The switching element 14 is connected at one end to the voltage terminal 19 and at the other end to the array 13 of switching elements and the capacitor 7. The switching element 15 is connected at one end to the voltage terminal 20 and at the other end to the array 13 of switching elements and the capacitor 7. The inverter 10 produces a complementary control signal CTLB11, and the control signal CTL11 and the complementary control signal CTLB11 are supplied to the switching element 14 and the switching element 15, respectively. The switching elements 14/15 complementarily turn on and off. The switching element 14 transfers the reference voltage V2 to the array 13 of switching elements and the capacitor 7 or interrupts the propagation of the reference voltage V2. On the other hand, the switching element 15 transfers the reference voltage V3 to the array 13 of switching element or interrupts the propagation of the reference voltage V3.

The array 11 of inverters is connected between the array 9 of AND gates and the array 13 of switching elements, and produces a complementary control signal CTLB12. The array of switching elements 13 turns on and off depending upon the potential level of the complementary control signal CTLB12 so as to transfer one of the reference voltages V2 and V3 to the array 6 of capacitor 6 or interrupt the propagation of the reference voltage V2/V3.

Figure 3:
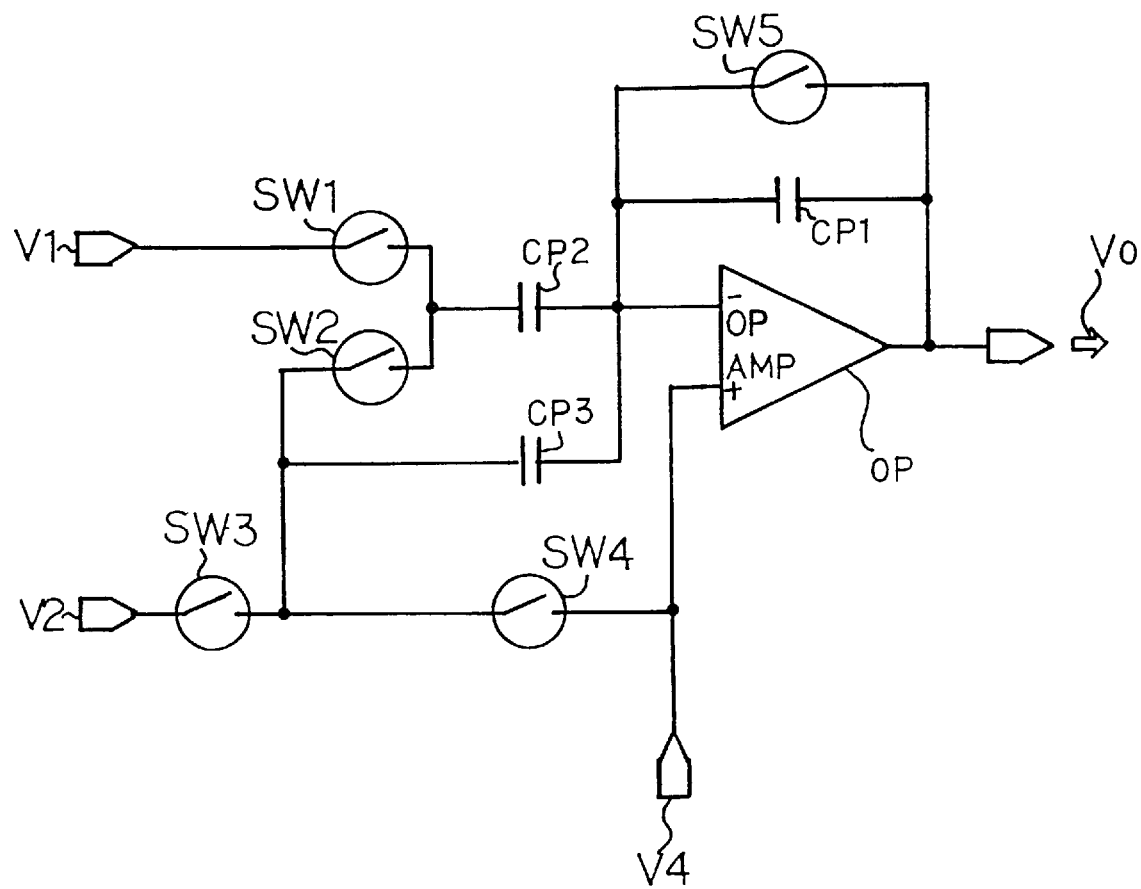
FIG. 3 is a circuit diagram showing a simple representation of the digital-to-analog converter.

Subsequently, description is made on the principle of the digital-to-analog conversion. FIG. 3 illustrates a simple representation of the digital-to-analog converter embodying the present invention. The voltage terminals 18 and 19 are respectively corresponding to voltage terminals V1 and V2, and voltage terminals 5 and 20 are represented by a single voltage terminal V4. The potential levels at the terminals V1, V2 and V4 are also referred to as V1, V2 and V4, respectively. The capacitor CP1 has capacitance $2^N$ times larger than reference capacitance C, and the capacitor CP2 has capacitance n times larger than the reference capacitance C. The capacitor CP3 has capacitance ($2^N-n$) times larger than the reference capacitance C. The switching elements SW1/SW3 and the switching elements SW2/SW4/SW5 are alternately changed between on-state and off-state.

First, the switching elements SW2/SW4/SW5 are closed, and the switching elements SW1/SW3 are opened. Then, the capacitors CP1, CP2 and CP3 are reset. The operational amplifier OP makes the output signal Vo equal to the potential level V4 at the non-inverted input node (+).

Subsequently, the switching elements SW1/SW3 are closed, and the switching elements SW2/SW4/SW5 are opened. Equation 1 is given on the basis of the principle of conservation of charge.

$$(Va-V1)nC+(Va-V2)(2^N-n)C+(Va-Vo)2^NC=0 \quad (1)$$

where Va is the potential level at the inverted input node (−) of the operational amplifier OP. Solve equation (1) for the output signal Vo. We obtain $$Vo=2\cdot Va-V2-(n/2^N)(V1-V2) \quad (2)$$

It is possible to assume the potential level Va to be equal to the potential level V4 at the non-inverted input terminal (+), and equation 3 is obtained from equation 2.

$$Vo=2\cdot V4-V2-(n/2^N)(V1-V2) \quad (3)$$

In equation 3, n represents an integer, and is varied from 0 to 2^N. We determine the output potential level Vo depending upon the value of n.

The capacitor CP2 is replaced with the array 6 of capacitors and the arrays 12/13 of switching elements, and we obtain the analog output signal Vout equivalent to the N-bit digital signal Di.

Next, we investigate the switching action between the switching elements SW1/SW3/SW5 and the switching elements SW2/SW4. First, the switching elements SW1/SW3/SW5 are closed, and the switching elements SW2/SW4 are opened. Thereafter, the switching elements SW1/SW3/SW5 are opened, and the switching elements SW2/SW4 are closed. Equation 4 is given on the basis of the principle of conservation of charge.

$$(V4-V1)nC+(V4-V2)(2^N-n)C=(Va-Vo)2^NC=0 \quad (4)$$

where Va is also the potential level at the inverted input node of the operational amplifier OP. It is also possible to assume Va=V4. Solve equation 4 for Vo. We obtain equation 5.

$$Vo=V2+(n/2^N)(V1-V2) \quad (5)$$

Modify equation 3 and equation 5. We obtain equation 6 and equation 7.

$$Vo=V4-\{V2+(n/2^N)(V1-V2)-V4\} \quad (6)$$

$$Vo=V4+\{V2+(n/2^N)(V1-V2)-V4\} \quad (7)$$

Comparing equation 6 with equation 7, it is understood that the output potential Vo is symmetrical with respect to the potential level V4. We conclude as follows. If the switching elements SW1, SW2, SW3, SW4 and SW5 are changed in the opposite order, the output potential Vo is varied with respect to the potential level V4.

The exclusive-OR gate 8 and the array 9 of AND gates controls the switching elements 3/14/15 and the arrays 12/13 of switching elements in response to the polarity control signal POL, the clock signal CLK and the digital signal Di, and the digital-to-analog converter shown in FIG. 2 realizes the aforementioned digital-to-analog conversion described in connection with the simple representation shown in FIG. 3.

Figure 4:
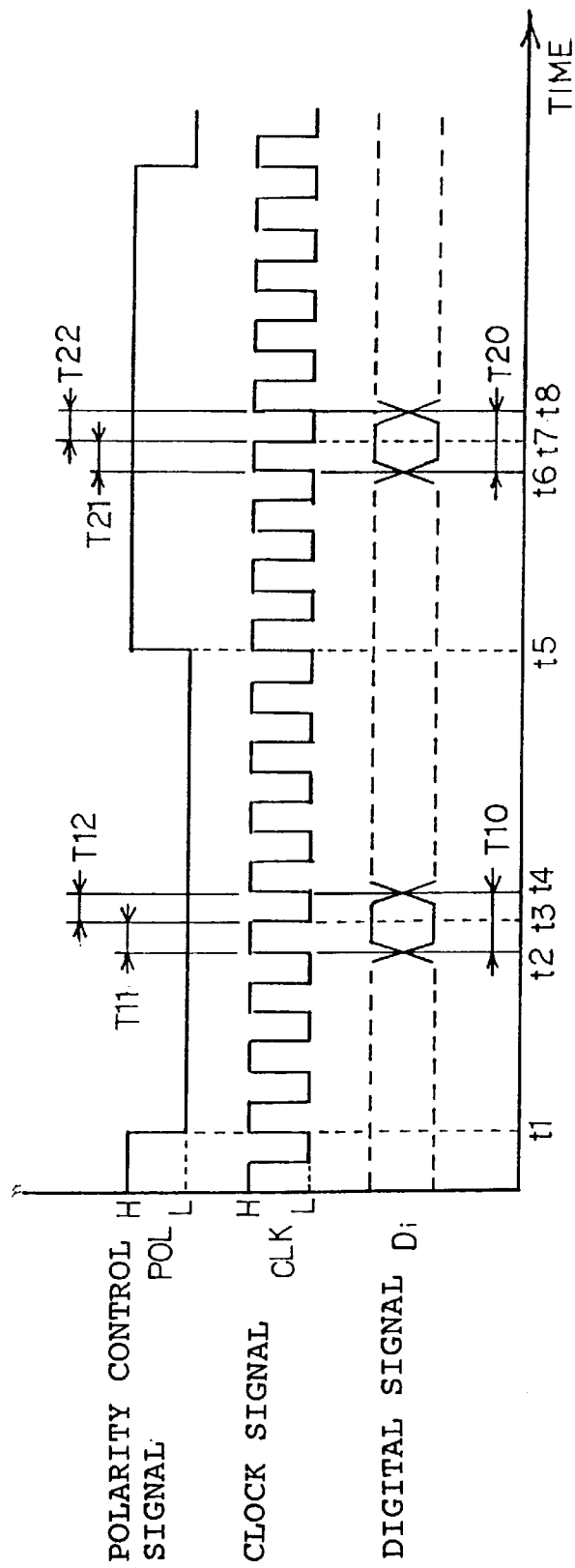
FIG. 4 is a timing chart showing the behavior of the digital-to-analog converter shown in FIG. 2.

FIG. 4 illustrates the digital-to-analog conversion achieved by the converter shown in FIG. 2. The polarity control signal POL is changed to the low level at time t1, and the digital signal Di is supplied to the array 9 of AND gates during time period T10 between time t2 and time t4. The clock signal CLK is in the high level between time t2 and time t3, i.e., sub-time period T11. The clock signal CLK is changed to the low level, and is maintained at the low level from time t3 to time t4, i.e., sub-time period T12.

In sub-time period T11, the switching element 3 is closed, and the exclusive-OR gate 8 changes the control signal CTL11 to the high level. The AND gates of the array 9 respectively determine the logic level of the control signals CTL12 depending upon the bits of the digital signal Di. The control signal CTL11 of the high level closes the switching element 14, and the switching element 14 supplies the reference voltage V2 to the array 13 of the switching elements and the capacitor 7. On the other hand, the complementary control signal CTLB11 of the low level causes the switching element 15 to be open, and the switching element 15 does not allow the reference voltage V3 to pass therethrough. For this reason, the switching elements of the array 12 are selectively closed and opened, and the switching elements of the array 13 are selectively closed and opened complementarily to the switching elements of the array 12. The closed switching elements of the array 12 transfer the reference voltage V1 to the associated capacitors Ci of the array 6, and the closed switching elements of the array 13 transfer the reference voltage V2 to the remaining capacitors Ci of the array 6. Thus, the capacitors Ci selectively accumulate the reference voltage V1 and the reference voltage V2.

On the other hand, while the digital-to-analog converter is in the sub-time period T12, the switching element 3 is opened, and the exclusive-OR gate 8 supplies the control signal CTL11 of the low level to the array 9 of AND gates and the inverter 10. The array 12 of switching elements is opened, and the array 13 of switching elements is closed. The switching element 14 is opened, and the switching element 15 is closed. As a result, the digital-to-analog converter carries out the digital-to-analog conversion on the basis of the electric charge accumulated in the capacitors Ci in the sub-time period T11. The analog output signal Vout is expressed by equation 8.

$$Vout=V4-(V2-V3)-(x/2^N)(V1-V2) \quad (8)$$

The polarity control signal POL is changed to the high level at time t5, and the digital signal Di is supplied to the array 9 of AND gates in time period T20 between time t6 and time t8. The clock signal CLK is changed from the high level to the low level at time t7, and the time period T20 is divided into time sub-period T21 and time sub-period T22.

In the time sub-period T21, the array 12 of switching elements is opened, and the array 13 of switching elements is closed. The switching element 14 is opened, and the switching elements 15 and 3 are closed. In the time sub-period T22, the arrays 12/13 of switching elements are selectively closed and opened depending upon the logic level of the component bits of the digital signal Di, the switching element 14 is closed, and the switching elements 15/3 are opened. The analog output signal Vout is expressed as $$V\text{out} = V4 + (V2-V3) - (x/2^N)(V1-V2) \qquad (9)$$

The reference voltage V4 is adjusted to a half of the positive power voltage level, and the reference voltage V3 is adjusted to a half of the reference voltage V4. Then, the difference between the reference voltage levels V1 and V2, i.e., (V1−V2) is regulated to an intermediate potential level between the reference voltage V3 and the sum of reference voltage levels V3 and V4, i.e., (V3+V4). Comparing equation 8 with equation 9, it is understood that the analog output signal Vout varies the potential level with respect to the reference level V4.

As will be understood from the foregoing description, although only one capacitor array 6 is incorporated in the digital-to-analog converter according to the present invention, the polarity control signal POL causes the exclusive0OR gate 8 and the AND array 9 to change the switching actions of the switching elements 12/13/14/15, and the digital-to-analog converter varies the analog output signal Vout with respect to the reference voltage V4. For this reason, the only one capacitor array 6 makes the arrangement of the digital-to-analog converter simple.

In this instance, the reference voltages V1, V2, V3 and V4 are adjusted to 4.5 volts, 4 volts, 2.5 volts and 5 volts, respectively. The arrays 12/13 of switching elements and the switching elements 14/15 as a whole constitute a switching unit, and the exclusive-OR gate 8, the array 9 of AND gates and inverters 10/11 as a whole constitute a controlling unit.

Second Embodiment

Figure 5:
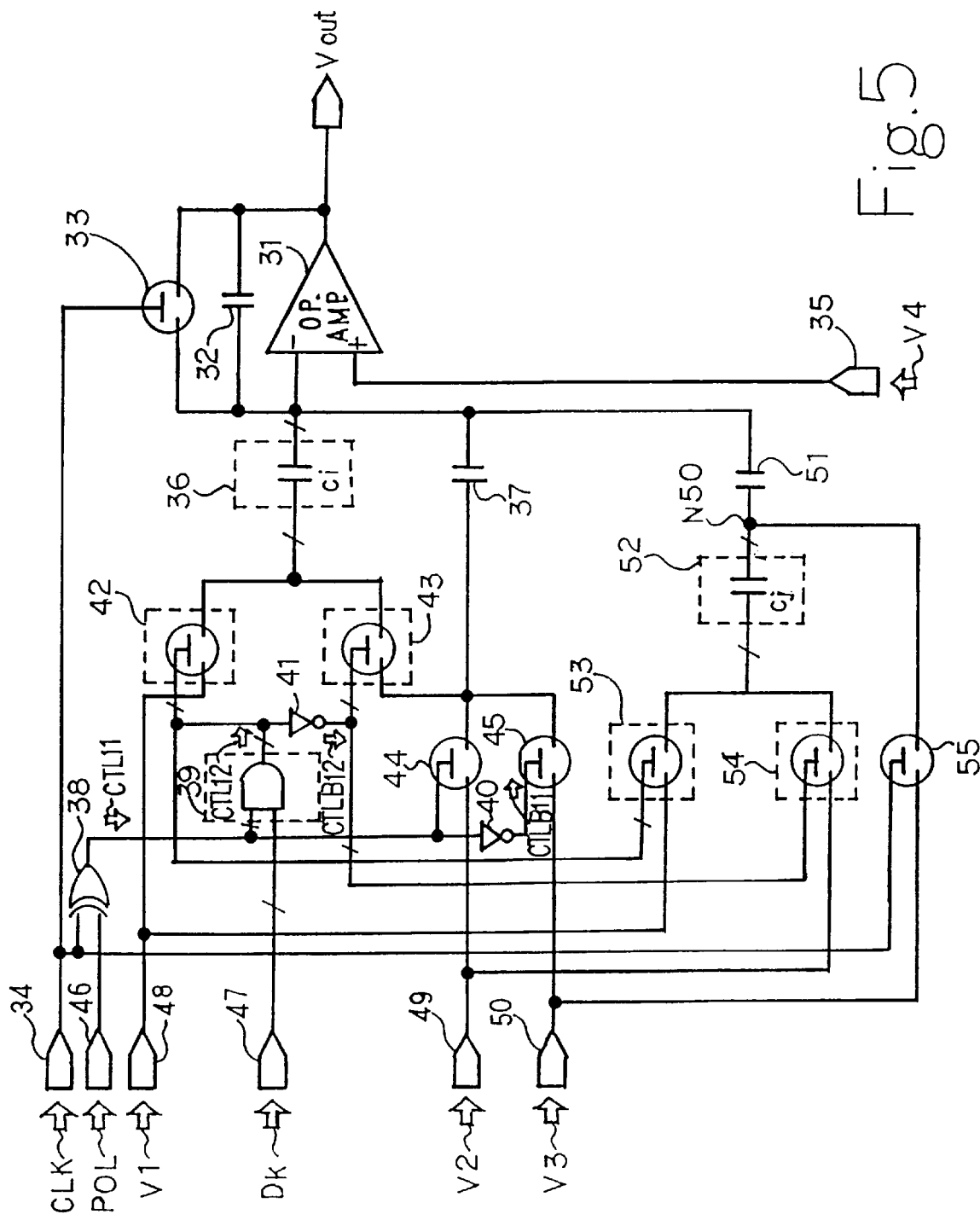
FIG. 5 is a circuit diagram showing circuit configuration of another digital-to-analog converter according to the present invention.

FIG. 5 illustrates another digital-to-analog converter embodying the present invention. In this instance, a digital signal Dk is separated into N bits and M bits, and the digital-to-analog converter processes N bits and the M bits, separately. The digital-to-analog converter implementing the second embodiment comprises an operational amplifier 31, a capacitor 32, a switching element 33, a clock terminal 34, a voltage terminal 35, a capacitor array 36, a capacitor 37, an exclusive-OR gate 38, an array of AND gates 39, an inverter 40, an inverter array 41, an array 42 of switching elements, an array 43 of switching elements, switching elements 44/45, a control terminal 46, a data terminal 47 and voltage terminals 47/48/49, and the operational amplifier 31, the capacitor 32, the switching element 33, the clock terminal 34, the voltage terminal 35, the capacitor array 36, the capacitor 37, the exclusive-OR gate 38, the array of AND gates 39, the inverter 40, the inverter array 41, the array 42 of switching elements, the array 43 of switching elements, the switching elements 44/45, the control terminal 46, the data terminal 47 and the voltage terminals 47/48/49 are respectively corresponding to the operational amplifier 1, the capacitor 2, the switching element 3, the clock terminal 4, the voltage terminal 5, the capacitor array 6, the capacitor 7, the exclusive-OR gate 8, the array of AND gates 9, the inverter 10, the inverter array 11, the array 12 of switching elements, the array 13 of switching elements, the switching elements 14/15, the control terminal 16, the data terminal 17 and the voltage terminals 47/48/49. Since the digital signal Dk consists of (M+N) bits, the array 39 has (M+N) AND gates, and (M+N) bits form the control signals CTL12. The other component elements are not described herein-below for the sake of simplicity.

The digital-to-analog converter further comprises a capacitor 51 connected to the inverted input node (−) of the operational amplifier 31 and an array 52 of capacitors connected through a node N50 to the capacitor 51. The capacitor 51 has capacitance equal to the reference capacitance C. The array 52 of capacitors or the capacitor array 52 has M capacitors Cj where j is an integer and ranges between zero and (M−1), i.e., $0 \leq j \leq M-1$, and the capacitance of the capacitor Cj is stepwise increased from $2^0 C$ to $2^{M-1} C$.

The digital-to-analog converter further comprises an array 53 of switching elements connected between the voltage terminal 48 and the capacitor array 52. The array 53 has M switching elements, and these switching elements are connected to the capacitors Cj of the array 52. The array 53 of switching elements is responsive to the control signals CTL12 so as to selectively connect the capacitors Cj to the voltage terminal 48 or interrupt the propagation of the reference voltage V1.

The digital-to-analog converter further comprises an array 54 of switching elements connected between the voltage terminal 49 and the capacitors Cj of the array 52, and M switching elements form the array 54. The array 54 of switching elements is responsive to the complementary control signal CTLB12 so as to selectively connect the capacitors Cj to the voltage terminal 49 or interrupt the propagation of the reference voltage V2.

The digital-to-analog converter further comprises a switching element 55 connected between the voltage terminal 50 and the node N50, and the switching element 55 is responsive to the clock signal CLK so as to connect the node N50 to the voltage terminal 50 or interrupt the propagation of the reference voltage V3.

Thus, the digital-to-analog converter separately processes the (M+N)-bit digital signal Dk. The clock signal CLK, the polarity control signal POL and the digital signal Dk are supplied to the digital-to-analog converter as shown in FIG. 4, and the digital-to-analog converter converts the digital signal Dk to the analog output signal Vout as follows.

In the sub-time period T11, the clock signal CLK is changed to the high level, and the exclusive-OR gate 38 changes the control signal CTL to the high level. The control signal CTL enables the AND gates 39, and the AND gates 39 selectively change the control signals CTL12 to the high level and the low level depending upon the logic level of the (M+N) bits of the digital signal Dk. Then, the control signals CTL12 selectively close and open the switching elements of the arrays 42/43/53/54. The switching elements 33/44/55 are closed, and the switching element 45 is opened. The closed switching elements of the arrays 42/53 supply the reference voltage V1 to the associated capacitors Ci and Cj of the arrays 36/52, and the closed switching elements of the arrays 43/54 supply the reference voltage V2 to the associated capacitors Ci and Cj of the arrays 36/52. Thus, the reference voltages V1/V2 are selectively accumulated in the capacitors Ci and Cj in the sub-time period T11.

The clock signal CLK is changed to the low level at time t3, and is maintained in the low level in the sub-time period T12. The exclusive-OR gate 38 changes the control signal CTL11 to the low level, and the AND gates 39 changes the control signals CTL12 to the low level. The switching elements of the arrays 42/53 are opened, and the switching elements of the other arrays 43/54 are closed. The switching elements 33/44/55 are opened, and the switching element 45 is closed. Then, the operational amplifier 31 changes the analog output signal Vout as calculated by equation 10.

$$V\text{out}=V4-(V2-V3)+\{(x/2^N)+(y/2^M)\}(V1-V2) \quad (10)$$

Subsequently, the polarity control signal POL is changed to the high level at time t5, and another digital signal Dk is supplied to the data terminal 47 in the time period T20. In the sub-time period T21, the switching elements of the arrays 42/53 are opened, and the switching elements of the arrays 43/54 are closed. The switching element 44 is opened, the switching element 45 is closed, and the switching elements 33 and 55 are closed.

The clock signal CLK is changed to the low level in the sub-time period T22, and the switching elements of the arrays 42/43/53/54 are selectively opened and closed depending upon the logic level of the (M+N) bits of the digital signal Dk. The switching element 44 is closed, the switching element 45 is opened, and the switching elements 33/55 are opened. Then, the operational amplifier 31 varies the analog output signal Vout as follows.

$$V\text{out}=V4+(V2-V3)+\{(x/2^N)+(y/2^M)\}(V1-V2) \quad (11)$$

The reference voltage V4 is adjusted to a half of the positive power voltage level, and the reference voltage V3 is adjusted to a half of the reference voltage V4. Then, the difference between the reference voltage levels V1 and V2, i.e., (V1-V2) is regulated to an intermediate potential level between the reference voltage V3 and the sum of reference voltage levels V3 and V4, i.e., (V3+V4). Comparing equation 10 with equation 11, it is understood that the analog output signal Vout varies the potential level with respect to the reference level V4. The digital-to-analog converter achieves all the advantages of the first embodiment.

Application to Driver of Liquid Crystal Display

Figure 6:
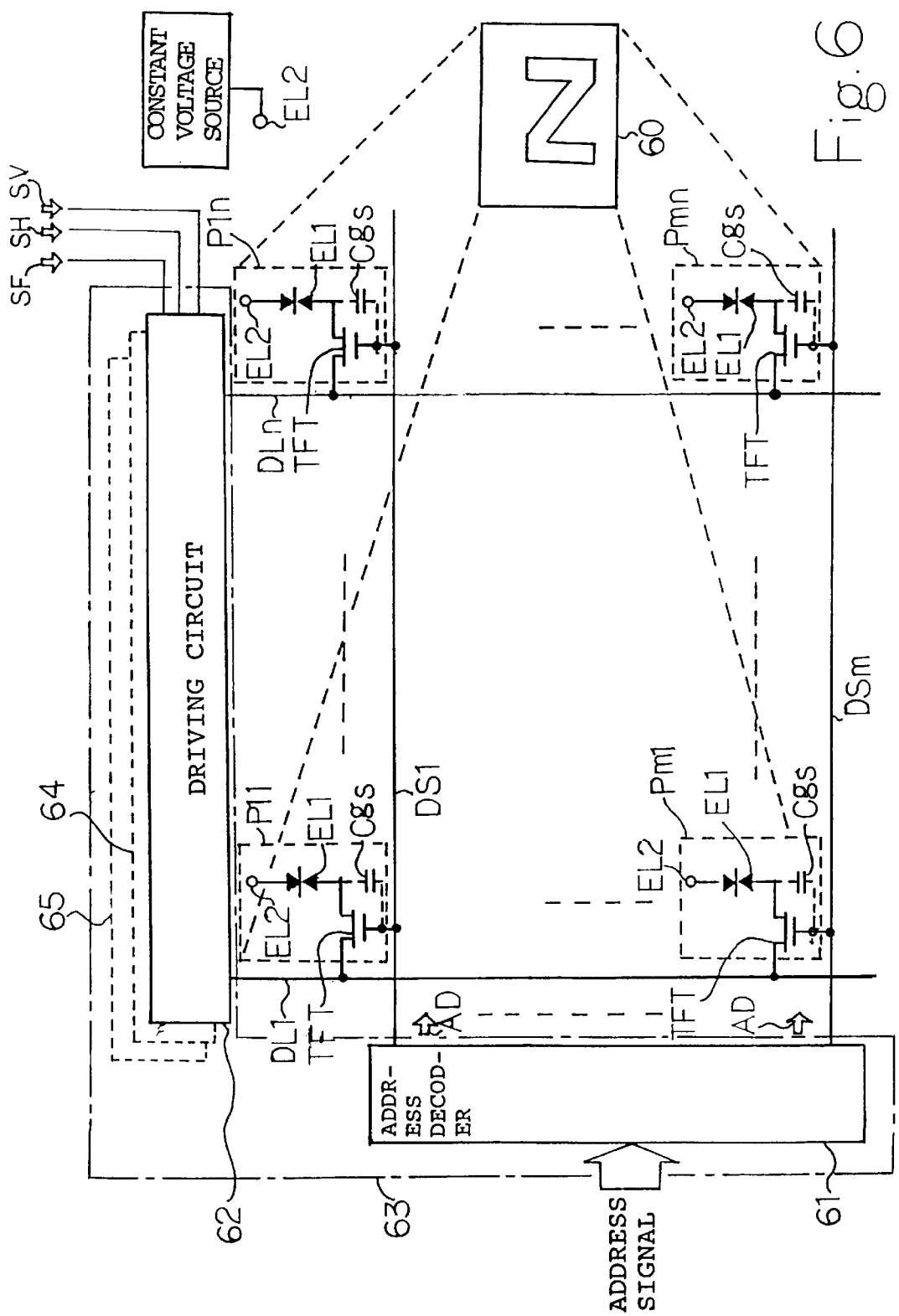
FIG. 6 is a circuit diagram showing a liquid crystal display with a driving circuit according to the present invention.

The digital-to-analog converters shown in FIGS. 2 and 5 are available for a liquid crystal display. FIG. 6 illustrates an active matrix liquid crystal display. The active matrix liquid crystal display comprises plural pixels P11 to P1n, . . . And Pm1 to Pmn, and a thin film switching transistor TFT, a pixel electrode EL1, a part of counter electrode EL2 and liquid crystal therebetween form each of the plural pixels P11 to Pmn. The pixels P11 to Pmn form a screen 60, and an image such as "N" is produced on the screen 60. Plural data lines DL1 to DLn are selectively connected to the drain nodes of the thin film switching transistors TFT of the pixels P11 to Pmn, and plural address lines DS1 to DSm are selectively connected to the gate electrodes of the thin film switching transistors TFT of the pixels P11 to Pmn.

The active matrix liquid crystal display further comprises an address decoder 61 and a driving circuit 62. The address decoder 61 decodes an address signal, and selectively changes the address lines DS1 to DSm to active level.

The driving circuit 62 includes the digital-to-analog converter shown in FIG. 3 or FIG. 5. A frame control signal SF, a horizontal scanning bit synchronous signal SH and a digital video signal SV are supplied to the digital-to-analog converter as the polarity control signal POL, the clock signal CLK and the digital signal Di/Dk. The frame control signal SF changes the potential level between the high level and the low level at each frame. In this instance, the driving circuit 62 and the address decoder 61 are integrated on a single semiconductor chip 63.

If the active matrix liquid crystal display is expected to form a full-color image on the screen 60, the pixels are tripled for the primary three colors, and the driving circuit 62 is also tripled as indicated by broken lines 64/65. In this instance, the other driving circuits 64/65 may be integrated on the semiconductor chip 63.

Although particular embodiments of the present invention have been shown and described, it will be obvious to those skilled in the art that various changes and modifications may be made without departing from the spirit and scope of the present invention.

Only the driving circuit 62 or circuits 62/64/65 may be integrated on a single semiconductor chip.

If the reference voltages V1 and V4 are properly regulated between the positive power voltage level and the ground level, the digital-to-analog converter is less affected by fluctuation of the positive power voltage/ground voltage.

What is claimed is:

1. A digital-to-analog converter comprising an operational amplifier having an inverted input node, a non-inverted input node and an output node, a first capacitor connected between said output node and said inverted input node and having a capacitance $2^N$ times larger than a reference capacitance, said N is a natural number, a first capacitor array connected to said inverted input node and having a plurality of second capacitors equal in number to said N and different in capacitance from one another, the capacitance of said plurality of second capacitors being stepwise varied from $2^0$ times larger than said reference capacitance to $2^{N-1}$ times larger than said reference capacitance, a third capacitor connected to said inverted input node and having a capacitance equal to said reference capacitance, a first switching element connected between said output node and said inverted input node and responsive to a first control signal so as to electrically connect said output node to said inverted input node, a switching unit having an input port connected to a source of first voltage, a source of second voltage, a source of third voltage and source of fourth voltage and an output port connected to said plurality of second capacitors, said third capacitor and said non-inverted input node and responsive to a second control signal so as to selectively supply said first voltage level, said second voltage level and said third voltage level to said plurality of second capacitors and said third capacitor, said switching unit continuously supplying said fourth voltage to said non-inverted input node, and a controlling unit connected to said switching unit and responsive to external control signals and a digital signal having data bits equal in number to said N so as to change said first control signal and said second control signal between an active level and an inactive level, said external signals defining a first time period, a second time period next to said first time period, a third time period after said second time period and a fourth time period next to said third time period depending upon the combination of potential levels of said external control signals, said digital signal being indicative of a first analog value in said first and second time periods and a second analog value in said third and fourth time periods, said controlling unit causing said first switching element to electrically connect said output node to said inverted input node in said first time period and said third time period and disconnect said output node from said inverted input node in said second time period and said fourth time period, said controlling unit causing said switching unit to selectively supply said first voltage and said second voltage to said plurality of second capacitors depending upon said data bits and supply said second voltage to said third capacitor in said first time period, said controlling unit causing said switching unit to supply said third voltage to said plurality of second capacitors and said third capacitor in said second time period so that said operational amplifier determines an output potential level at said output node, said controlling unit causing said switching unit to supply said third voltage to said plurality of second capacitors and said third capacitor in said third time period, said controlling unit causing said switching unit to selectively supply said first voltage and said second voltage to said plurality of second capacitors depending upon said data bits and supply said second voltage to said third capacitor in said fourth time period, thereby causing said operational amplifier to determine said output potential level.

2. The digital-to-analog converter as set forth in claim 1, in which said third voltage is equal to said fourth voltage.

3. The digital-to-analog converter as set forth in claim 1, in which said third voltage is different in magnitude from said fourth voltage.

4. The digital-to-analog converter as set forth in claim 3, in which the difference between said first voltage and said second voltage is between said third voltage and the sum of said third voltage and said fourth voltage.

5. The digital-to-analog converter as set forth in claim 1, in which said switching unit includes
   a first switching array having a plurality of second switching elements equal in number to said N and connected between said source of first voltage and said plurality of second capacitors and responsive to first sub-control signals of said second control signal so as to be changed between open-state and closed-state,
   a second switching array having a plurality of third switching elements equal in number to said N and connected between a common node and said plurality of second capacitors and responsive to second sub-control signals of said second control signal complementary to said first sub-control signals so as to be changed between said open-state and said closed-state, said common node being further connected to said third capacitor,
   a fourth switching element connected between said source of second voltage and said common node and responsive to a third sub-control signal of said second control signal so as to be changed between said open-state and said closed-state, and
   a fifth switching element connected between said source of third voltage and said common node and responsive to a fourth sub-control signal of said second control signal complementary to said third sub-control signal so as to be changed between said open-state and said closed-state.

6. The digital-to-analog converter as set forth in claim 5, in which said controlling unit includes
   an exclusive-OR gate supplied with one of said external control signal and another of said external control signal serving as said first control signal for producing said third sub-control signal,
   a first logic gate array enabled with said third sub-control signal and responsive to said data bits of said digital signal so as to produce said first sub-control signals,
   a second logic gate array supplied with said first sub-control signals so as to produce said second sub-control signals, and
   an inverter supplied with said third sub-control signal so as to produce said fourth sub-control signal.

7. The digital-to-analog converter as set forth in claim 6, in which said first logic gate array has a plurality of AND gates equal in number to said N, and said second logic gate array has a plurality of inverters equal in number to said N.

8. The digital-to-analog converter as set forth in claim 5, in which one of said external control signals is a pulse signal changing the voltage level thereof at a first transit time between said first time period and said second time period and a second transit time between said third time period and said fourth time period, and another of said external control signals changes the voltage level thereof between said first and second time periods and said third and fourth time periods.

9. The digital-to-analog converter as set forth in claim 1, further comprising
   a fourth capacitor connected to said inverted input node and having a capacitance equal to said reference capacitance, and
   a second capacitor array connected between said fourth capacitor and said switching unit and having a plurality of fifth capacitors equal in number to a natural number and different in capacitance from one another, the capacitance of said plurality of fifth capacitors being stepwise varied from $2^0$ times larger than said reference capacitance to $2^{M-1}$ times larger than said reference capacitance where M is said natural number equal to additional data bits of said digital signal,
   said data bits and said additional data bits being indicative of a first analog value in said first and second time periods and a second value in said third and fourth time periods,
   said controlling unit causing said switching unit to supply said third voltage to another common node between said second capacitor array and said fourth capacitor in said first time period and said third time period,
   said controlling unit causing said switching unit to selectively supply said first voltage and said second voltage to said plurality of fifth capacitors depending upon said additional data bits in said first time period and said fourth time period,
   said controlling unit causing said switching unit to supply said second voltage to said plurality of fifth capacitors in said second time period and said third time period.

10. The digital-to-analog converter as set forth in claim 9, in which said switching unit includes
    a first switching array having a plurality of second switching elements equal in number to said N, connected between said source of first voltage and said plurality of second capacitors and responsive to first sub-control signals of said second control signal so as to be changed between open-state and closed-state,
    a second switching array having a plurality of third switching elements equal in number to said N, connected between a common node and said plurality of second capacitors and responsive to second sub-control signals of said second control signal complementary to said first sub-control signals so as to be changed between said open-state and said closed-state, said common node being further connected to said third capacitor, a fourth switching element connected between said source of second voltage and said common node and responsive to a third sub-control signal of said second control signal so as to be changed between said open-state and said closed-state, a fifth switching element connected between said source of third voltage and said common node and responsive to a fourth sub-control signal of said second control signal complementary to said third sub-control signal so as to be changed between said open-state and said closed-state, a third switching array having a plurality of sixth switching elements, equal in number to said M, connected between said source of first voltage and said plurality of fifth capacitors and responsive to said first sub-control signals so as to be changed between said open-state and said closed-state, a fourth switching array having a plurality of seventh switching elements connected between said source of second voltage and said plurality of fifth capacitors and responsive to said second sub-control signals so as to be changed between said open-state and said closed-state, and an eighth switching element connected between said source of third voltage and said another common node and responsive to said first control signal so as to be changed between said open-state and said closed-state.

11. The digital-to-analog converter as set forth in claim 10, in which said controlling unit includes an exclusive-OR gate supplied with one of said external control signal and another of said external control signal serving as said first control signal for producing said third sub-control signal, a first logic gate array enabled with said third sub-control signal and responsive to said data bits and said additional data bits so as to produce said first sub-control signals, a second logic gate array supplied with said first sub-control signals so as to produce said second sub-control signals, and an inverter supplied with said third sub-control signal so as to produce said fourth sub-control signal.

12. The digital-to-analog converter as set forth in claim 11, in which said first logic gate array has a plurality of AND gates equal in number to the total of said N and said M, and said second logic gate array has a plurality of inverters equal in number to the total of said N and said M.

13. The digital-to-analog converter as set forth in claim 1, in which said external control signals are a frame control signal and a horizontal scanning bit synchronous signal and said data signal is a digital video signal so that said digital-to-analog converter forms a part of a driving circuit incorporated in a liquid crystal display.

14. The digital-to-analog converter as set forth in claim 13, in which said driving circuit is integrated on a single semiconductor chip.

15. The digital-to-analog converter as set forth in claim 14, in which other driving circuits are further integrated on said single semiconductor chip, and each of said other driving circuits includes said digital-to-analog converter.

16. The digital-to-analog converter as set forth in claim 9, in which said external control signals are a frame control signal and a horizontal scanning bit synchronous signal and said data signal is a digital video signal so that said digital-to-analog converter forms a part of a driving circuit incorporated in a liquid crystal display.

17. The digital-to-analog converter as set forth in claim 16, in which said driving circuit is integrated on a single semiconductor chip.

18. The digital-to-analog converter as set forth in claim 17, in which other driving circuits are further integrated on said single semiconductor chip, and each of said other driving circuits includes said digital-to-analog converter.

19. A method of controlling a digital-to-analog converter defined in claim 1, comprising the steps of:

keeping one of said external signals in a first level in said first and second time periods equal to a pulse of another of said external signals, changing said one of said external signals in a second level different from said first level in said third and fourth time periods equal to said pulse period of said another of said external signals thereby causing said operational amplifier to vary the voltage level at said output node with respect to said fourth voltage.

20. A method of controlling a digital-to-analog converter defined in claim 9, comprising the steps of:

keeping one of said external signals in a first level in said first and second time periods equal to a pulse of another of said external signals, changing said one of said external signals in a second level different from said first level in said third and fourth time periods equal to said pulse period of said another of said external signals thereby causing said operational amplifier to vary the voltage level at said output node with respect to said fourth voltage.

* * * * *